(12) United States Patent
Sadleir

(10) Patent No.: US 8,674,302 B2
(45) Date of Patent: Mar. 18, 2014

(54) SUPERCONDUCTING TRANSITION EDGE SENSORS AND METHODS FOR DESIGN AND MANUFACTURE THEREOF

(75) Inventor: John E. Sadleir, Washington, DC (US)

(73) Assignee: The United States of America as represented by the Administrator of the National Aeronautics Space Administration, Washington, DC (US)

( * ) Notice: Subject to any disclaimer, the term of this patent is extended or adjusted under 35 U.S.C. 154(b) by 396 days.

(21) Appl. No.: 12/789,937

(22) Filed: May 28, 2010

(65) Prior Publication Data

US 2010/0327163 A1    Dec. 30, 2010

Related U.S. Application Data

(60) Provisional application No. 61/182,782, filed on Jun. 1, 2009.

(51) Int. Cl.
*H01L 27/18* (2006.01)

(52) U.S. Cl.
USPC ...................................... 250/336.2

(58) Field of Classification Search
USPC ...................................... 250/336.2
See application file for complete search history.

(56) References Cited

U.S. PATENT DOCUMENTS

| | | | |
|---|---|---|---|
| 5,448,098 A * | 9/1995 | Shinohara et al. | 257/441 |
| 5,552,375 A * | 9/1996 | Nishino et al. | 505/330 |
| 5,880,468 A * | 3/1999 | Irwin et al. | 250/336.2 |
| 6,455,849 B1 * | 9/2002 | Hilton et al. | 250/336.2 |
| 8,055,318 B1 * | 11/2011 | Kadin | 505/190 |
| 2002/0171040 A1 * | 11/2002 | Goldie et al. | 250/336.2 |

OTHER PUBLICATIONS

Tachikawa et al., "Potential Methods for the Fabrication of High-Tc Superconductors for Wires and Cables," Proceedings of the IEEE, vol. 77, No. 8, 1124-1131, 1989.*

* cited by examiner

*Primary Examiner* — David Porta
*Assistant Examiner* — Edwin Gunberg

(57) ABSTRACT

Methods for forming sensors using transition edge sensors (TES) and sensors therefrom are described. The method includes forming a plurality of sensor arrays includes at least one TES device. The TES device includes a TES device body, a first superconducting lead contacting a first portion of the TES device body, and a second superconducting lead contacting of a second portion of the TES device body, where the first and second superconducting leads separated on the TES device body by a lead spacing. The lead spacing can be selected to be different for at least two of the plurality of sensor arrays. The method also includes determining a transition temperature for each of the plurality of sensor arrays and generating a signal responsive to detecting a change in the electrical characteristics of one of the plurality of sensor arrays meeting a transition temperature criterion.

5 Claims, 8 Drawing Sheets

100

130

140

150

160

200

300

400

500

SUPERCONDUCTING TRANSITION EDGE SENSORS AND METHODS FOR DESIGN AND MANUFACTURE THEREOF

CROSS REFERENCE TO RELATED APPLICATIONS

This application claims the benefit of U.S. Patent Application Ser. No. 61/182,782, entitled "NOVEL SUPERCONDUCTING TRANSITION EDGE SENSOR DESIGN," filed Jun. 1, 2009, which is herein incorporated by reference in its entirety.

This application is related to co-pending U.S. patent application Ser. No. 12/789,954, entitled "SUPERCONDUCTING TRANSITION EDGE SENSORS AND METHODS FOR DESIGN AND MANUFACTURE THEREOF," filed concurrently herewith.

BACKGROUND

1. Technical Field

The present disclosure relates to sensors, and more specifically, to superconducting transition edge sensors and methods for design and manufacture thereof.

2. Introduction

A wide variety of particle detectors, energy detectors, and other devices can be made using a superconducting transition edge sensor (TES) as a thermal energy sensor, thermometer, bolometer, or microcalorimeter. By operating the device such that the TES is in the superconducting transition temperature region (i.e., the temperature region in which the material switches from normal conducting properties to superconducting properties) any heat deposited in the TES can be precisely measured due to the strong dependence of its conductivity (or conversely electrical resistance) on the temperature. Thus, very precise measurements of temperature changes and/or detection of an incident particles providing even minute heating, can be performed. The device can also be used as a high resolution spectrometer with the energy of the absorbed particle determined by the measured heat pulse in the detector (when used as a microcalorimeter) or a change in absorbed power when a flux of particles are detected (when used as a bolometer). Manifestation of devices include a single TES thermally connected to a single particle absorbing material, a single TES thermally connected to multiple absorbers, or multiple TESs thermally connected to a single absorber body, it is also possible for the TES sensor to act as both the thermistor and absorber. Considerations when selecting an absorber material and absorber design is chosen such that it efficiently absorbs the particle of interest, has a sufficiently fast thermalization time to meet timing requirements, is compatible connecting with the TES body, and a heat capacity large enough such that heat pulses from particles of highest energy do not saturate but no so large that the energy resolution is sufficiently degraded.

Several conventional methods for fabricating TES-based detectors are available. For example, a TES device with a body consisting of a uniform superconductor material, having a target superconducting transition temperature ($T_c$) corresponding to the temperature of interest can be fabricated. In another method, the superconducting materials can be doped with magnetic impurities. In such devices, the concentration of magnetic particles is used to modify the $T_c$ of the superconducting material being used for the body. In another method, the body of the TES device can be formed using a bilayer structure consisting of a normal metal layer (i.e., a metal layer that is not superconducting at the operating temperatures of interest when in isolation) disposed on a superconductor layer formed on a supporting substrate. Such devices take advantage of the proximity effect. That is, when a clean interface is provided between a superconducting film and a normal metal film, and the films are thinner than their coherence lengths, the bilayer acts as a single superconducting film with a transition temperature suppressed from that of the bare superconductor. Consequently, the superconducting transition temperature ($T_c$) and the heat diffusion properties of the TES device can be modulated by careful selection of the thickness of the layers. However, precisely achieving a target $T_c$ is typically difficult, principally due to the process variations typically associated with conventional TES device manufacturing processes.

SUMMARY

Additional features and advantages of the disclosure will be set forth in the description which follows, and in part will be obvious from the description, or can be learned by practice of the herein disclosed principles. The features and advantages of the disclosure can be realized and obtained by means of the instruments and combinations particularly pointed out in the appended claims. These and other features of the disclosure will become more fully apparent from the following description and appended claims, or can be learned by the practice of the principles set forth herein.

Disclosed are systems, methods, and non-transitory computer-readable storage media for forming sensors using transition edge sensors (TES) and their form are described. In one exemplary embodiment, a method includes forming a plurality of sensor arrays including at least one transition edge sensor (TES) device. The TES device includes a TES device body, a first superconducting lead extending over a first portion of the TES device body, and a second superconducting lead extending of a second portion of the TES device body, where the first and second superconducting leads are separated on the TES device body by a lead spacing, where the lead spacing is selected to be different for at least two of the plurality of sensor arrays. The method also includes determining a transition temperature for each of the plurality of sensor arrays and generating one or more signals responsive to detecting a change in the electrical characteristics of one of the plurality of sensor arrays meeting transition temperature criteria.

In another exemplary embodiment, a transition edge sensor (TES) is provided. The TES includes a substrate having an electrically insulating surface, a normal metal layer disposed on the electrically insulating surface, and a first superconducting lead disposed on a first portion of the normal metal layer. The TES also includes a second superconducting lead disposed on a second portion of the normal metal layer and separated on the normal metal from the first superconducting lead by a lead spacing, where the lead spacing is 20 times or less the normal metal coherence length for the normal metal layer for a target transition temperature.

In another exemplary embodiment, a computer-implemented method of designing a transition edge sensor (TES) sensor array is provided. The method causes a computing device to perform steps including defining a body for a TES device, the body includes a normal metal layer. The method also includes causing the computer device to define first and second superconducting leads for contacting the body, the first and the second leads separated by a lead spacing on the normal metal layer. The method further includes causing the computer device to adjust at least the lead spacing to provide a transition temperature for the TES device meeting transition temperature criteria.

BRIEF DESCRIPTION OF THE DRAWINGS

In order to describe the manner in which the above-recited and other advantages and features of the disclosure can be obtained, a more particular description of the principles briefly described above will be rendered by reference to specific exemplary embodiments thereof which are illustrated in the appended drawings. Understanding that these drawings depict only exemplary embodiments of the disclosure and are not therefore to be considered to be limiting of its scope, the principles herein are described and explained with additional specificity and detail through the use of the accompanying drawings in which.

DETAILED DESCRIPTION

Figure 1A:
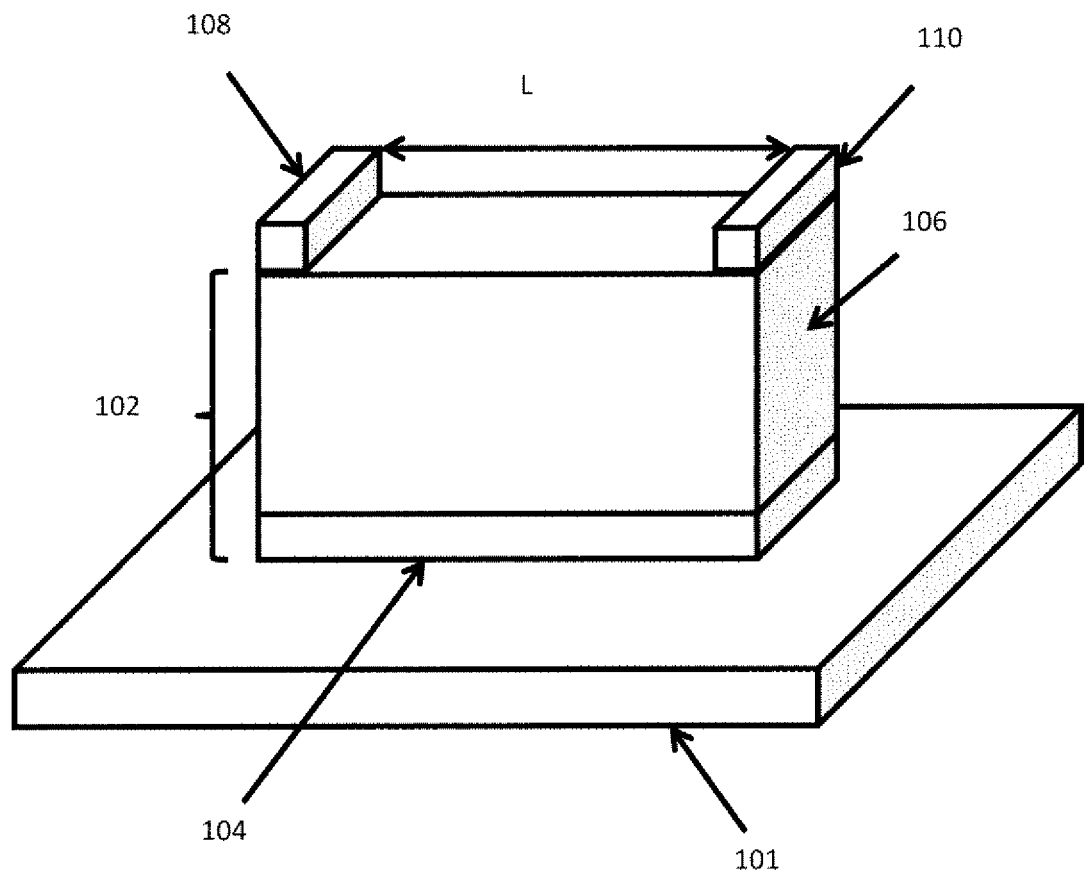
FIGS. 1A-1D show a perspective view of TES device.

Various exemplary embodiments of the disclosure are discussed in detail below. While specific implementations are discussed, it should be understood that this is done for illustration purposes only. A person skilled in the relevant art will recognize that other components and configurations may be used without parting from the spirit and scope of the disclosure.

As described above, TES devices can be used as sensors across much of the electromagnetic spectrum. As such, TES-based sensors are useful in a variety of fields, including materials microanalysis, mass spectroscopy of biomolecules, nuclear nonproliferation, synchrotron experiments, atomic physics, quantum information, dark-matter searches, and astrophysics, to name a few. However, to achieve high energy resolution for these applications, it is important to control both the $T_c$ and transition width ($\Delta T_c$) in a TES device. A transition width is generally used in lieu of transition edge to emphasize the fact that the transition is not instantaneous but rather requires a finite temperature range.

In general, since the energy resolution of calorimeters improves with decreasing temperature, many TES devices are typically designed to operate at temperatures around 0.1 K. For a TES, this requires a superconductor with $T_c$ in that range. While a few suitable elemental superconductors have a $T_c$ in this range, the best results have been achieved using proximity-coupled bilayers, as described above, in which $T_c$ is tuned by selection of the thicknesses of the superconducting (S) and normal metal (N) layers. However, as described above, a primary issue with TES-based detectors is that fabrication of TES devices is generally non-trivial with respect to obtaining a desired $T_c$. For example, process variation during the fabrication of TES devices can result in final layer thicknesses that deviate from target thicknesses. In most TES devices, even slight variations in layer thickness can significantly affect the resulting $T_c$ of a bilayer structure and render the TES device unusable for at least some types of particle detectors. In another example, it is generally difficult to produce a bilayer TES device in which the interface between the normal metal layer and the underlying superconductor layer is completely free of contaminants. Such contaminants have been found to introduce noise or alter the $T_c$ of bilayer TES devices. Chemical processes between the layers or interdiffusion of species at the interface can also cause problems in controlling $T_c$, $\Delta T_c$, uniformity and device behavior. Variation in intrinsic or extrinsic film stress is also known to cause changes in the resistive transition including $T_c$.

Efforts to improve the performance of such TES devices have generally focused on reducing noise, improving absorption characteristics, and improving the interface or boundary between the normal metal layer and the underlying superconducting film. As a result, the parameters for adjusting $T_c$ in bilayer and other TES structures during fabrication are still generally limited to selection of types of materials, doping of materials, transmissivity of the interface, film stress, and thicknesses of layers. However, control of such parameters is generally difficult in most conventional TES device fabrication processes. As a result, fabrication yields for TES-based detectors are generally low.

Therefore, in order to overcome the limitations of conventional TES devices and fabrication thereof, the various exemplary embodiments of the invention provide a novel methodology for fabricating TES devices by providing an additional degree of freedom for selecting $T_c$. In particular, exemplary embodiments of the invention provide a design methodology in which the spacing between the superconducting leads of TES devices over the TES device body is selectively adjusted to further modulate $T_c$. Thus, lead spacing provides an additional degree of freedom for designing TES devices. Furthermore, since lateral spacing targets are typically easier to achieve in monolithic processes typically used for fabricating TES devices, this degree of freedom can be adjusted with a relatively high degree of accuracy. Thus, target $T_c$'s are significantly easier to achieve, improving yield of TES device manufacturing processes.

As used herein, the term "spacing" or "lead spacing," with respect to the superconducting leads for a TES body refers to the average spacing of the portion of the superconducting leads contacting the device body of the TES device.

In general, a conventional bilayer structure or body in a TES device will have an intrinsic transition temperature $T_{ci}$ prior to attaching any leads thereto. However, when superconducting leads are connected to opposite ends of the body, superconductivity is also induced longitudinally into the body from the ends via a longitudinal proximity effect. In the longitudinal proximity effect model the superconducting order parameter is a maximum in the TES near the leads then decays to a minimum halfway between the leads. Traditionally, it has been believed that in order to induce superconductivity longitudinally in a bilayer structure, the spacing between the superconducting leads needs to be less than two times of the mean free path length of a normal metal layer, typically on the order of order the film thickness when mean free path thickness limited and no larger than a few μm's for bulk superconductor/normal metal/superconductor sandwiches with high a purity normal metal. Further, the effect of such induced superconductivity has generally been a shift in $T_c$ on the order of 100's of mK, further complicating design of TES-based sensors when superconducting leads are used.

However, the present inventor has discovered that for at least some types of TES device structures, the longitudinal proximity effect still induces superconductivity even when the superconducting leads are separated by 100's of um. Further, the present inventor has discovered that by providing superconductor lead spacing in the 100's of um, the shift in $T_c$ can be limited to 1 mK or less. Such mK $T_c$ shifts can even occur for lead separations L of over 1000 times the electron mean free path in the TES body. In particular, as described below, the present inventor has discovered that the amount of $T_c$ shift decreases predictably as $\sim 1/L^2$.

Accordingly, the various exemplary embodiments of the invention exploit this property to provide a new design methodology for TES devices. In particular, the various exemplary embodiments of the invention provide for design and fabrication of TES devices in which $T_c$ can be selected by (1) varying the thickness of the layers in the body of the TES device and (2) varying the spacing of superconducting leads over the body of the TES device. Thus, the various exemplary embodiments of the invention allow a desired to be targeted by selection of the thickness of layers in the body and the spacing of the superconducting leads to be used to fine-tune the final $T_c$. This is conceptually described with respect to FIG. 1A.

FIG. 1A shows a perspective view of a TES device 100. As shown in FIG. 1A, the TES device 100 includes a substrate 101 having an electrically insulating surface and a body 102 on substrate 101. In FIG. 1A, the body 102 includes of a superconducting layer 104 and a normal metal layer 106. The body 102 in FIG. 1A therefore forms a S/N structure having superconducting properties. In particular, normal metal electrons in 106 and superconducting order in 104 are diluted in the combined bilayer giving an intrinsic bilayer transition temperature $T_{ci}$. In general, the bilayer structure will have a $T_{ci}$ value that is dependent on the thicknesses of layers 104 and 106, the conditions at the interface between the layers 104 and 106, and the Fermi metal properties of 104 and 106.

Although the body 102 in FIG. 1A is shown as including a specific bilayer structure, the invention is not limited in this regard. In other exemplary embodiments of the invention, the body can include of a multi-layer structure. That is, a stack of alternating superconducting and normal metal layers on substrate 101. Further, the body 102 can also be formed by disposing the normal metal layer 106 on substrate 101 and thereafter forming the superconducting layer 104 on normal metal layer 106. Alternatively 102 may be a uniform superconductor, a magnetically doped superconductor, a normal metal, a semiconductor or semimetal, or a magnetically doped metal.

Substrate 101 is a material which has lower conductivity than the body 102 so that it does not create a conducting path around the body 102. Further a material for substrate 101 can be selected which is not a source of impurities to the body 102. In a one exemplary embodiment, the substrate is crystalline silicon substrate coated with a silicon nitride layer formed on its surface. However, the various exemplary embodiments of the invention are not limited in this regard and various other types of materials can be used to provide an electrically insulating surface for the body 102. The substrate can also be selected to be thermally conductive and can serve as a substrate to provide an absorber. Further, the substrate can be used to support additional circuits or devices coupled to the body 102.

Superconducting layer 104 and leads 108 and 110 can be made of any metal or metal alloy which is a superconductor at the operating temperature of the sensor. These superconducting layers can further be selected to be a metal that does not rapidly form a contaminant layer, such as an oxide, so that there are little or no impurities at their surfaces. A few elemental BCS superconductors include aluminum, molybdenum, titanium, and alloys including these metals. However, the invention is not limited in this regard and any other superconducting materials can be used in the various exemplary embodiments of the invention. Additionally, in some exemplary embodiments of the invention, superconducting layer 104 can be magnetically doped superconductors, for example, iron or manganese doped aluminum. However, the invention is not limited in this regard and other combinations of superconductors and magnetic impurities can be used in the various exemplary embodiments of the invention.

Normal metal layer 106 can be made of any metal or metal alloy which is a normal conductor at the operating temperature of the sensor. Layer 106 can be selected to be a normal metal that does not rapidly form a contaminant layer, such as an oxide, so that there are little or no impurities at its surface. Some normal metals include gold, silver, copper, palladium, platinum, gold/copper alloys, and palladium/gold alloys. An advantage of using metal alloys is their high sheet resistance, which is appropriate for some applications. The normal metal can also be a ferromagnetic material such as chromium, manganese, iron, cobalt and nickel, in which case the $T_c$ of the bilayer can be suppressed well below the $T_c$ of superconducting layer 104. In some cases, the normal metal can be a material such as tungsten which is a superconductor having a $T_c$ below the operating temperature of the sensor, but is a normal conductor at the operating temperature. However, the invention is not limited in this regard and any other normal metals can be used in the various exemplary embodiments of the invention. In some exemplary embodiments of the invention, the normal metal layer can be other types of electrically conductive materials, such as semimetals or semiconductors. Thus, the term "normal metal," as used herein, refers to any metal, semimetal, or semiconductor material lacking superconducting properties at the temperature of interest (i.e., having an intrinsic superconducting transition temperature in isolation $T_{ci}=0$). Additionally, in some exemplary embodiments of the invention, normal metal layer 106 can be a magnetically doped metal, semimetal, or semiconductor.

In the structure illustrated in FIG. 1A, when superconducting leads 108, 110 are disposed on the body 102, these superconducting leads also induce a superconducting order in 102. As a result, the TES device is effectively a SN'S structure and the $T_c$ of the TES device is increased above the transition temperature of body 102 in isolation's $T_{ci}$. TES $T_c$ becomes dependent on the $T_{ci}$ of the superconducting leads 108 and 110. However, since the order parameter is changing longitudinally in the TES and there is a region of minimum order parameter strength in 102 (in the particular TES designed in illustrated in FIG. 1A, the minimum is along the line bisecting L halfway between the leads). That is, the path between leads 108 and 110 through layer 102 operates as a superconducting weak link. It follows that the resistive transition and the devices $T_c$ is inherently current dependent and increasingly so as L is decreased. Further, as described above, the effect is strongly dependent on the spacing (L) between the leads 108 and 110. Thus, as the leads 108 and 110 are brought closer together (i.e., L is reduced), the strength of the order parameter at the minimum along the line bisecting L increases therefore increasing the devices $T_c$ for a given current. Conversely, as the leads 108 and 110 are separated (i.e., L is increased), the strength of the order parameter at the minimum along the line bisecting L decreases therefore decreasing the devices $T_c$ for a given current. Therefore, as the amount of superconductive order induced varies, the shift in $T_{ci}$ will also vary. This shift in $T_{ci}$ as a function of spacing is shown below in FIG. 2.

It is worth noting that the temperature at which the penetration of order into 102 is zero (i.e., no superconducting order induced) requires going above the $T_c$ of the superconducting material for lead 108 and 110. This temperature is typically much higher than the device operating temperature (e.g., lead $T_c$ is often of the order of several Kelvin as compared to a 100 mK $T_c$ device). As a result, this produces at temperatures higher than the sharp resistive transition a gradual decrease in resistance as the temperature is lowered corresponding to a small leakage of superconducting from 108 and 110 into 102. Therefore, in some exemplary embodiments of the invention, this property of the longitudinal proximity effect on the normal state slope can be used as a design feature in TESs to provide extended spectra range of suboptimal energy resolution. That is, the detector can then be designed to give the best energy resolution in a specified particle energy window. Thus, this feature is operative to prevent heat pulses from saturating the TES device for particles above this energy range by using these variations in the slope of the transition to measure these particles with suboptimal energy resolution.

In the various exemplary embodiments of the invention, the interface between the leads 108 and 110 and the body 102 can be formed to provide a "clean" interface (substantially free of native oxide or other impurities). However, in other exemplary embodiments, the amount of impurities at this interface can be modulated to allow at least a thin insulating layer between leads 108 and 110 and body 102. Such an interface can help in reducing the size of the TES pixels while maintaining narrow transition widths desired for optimal energy resolution performance.

Figure 1B:
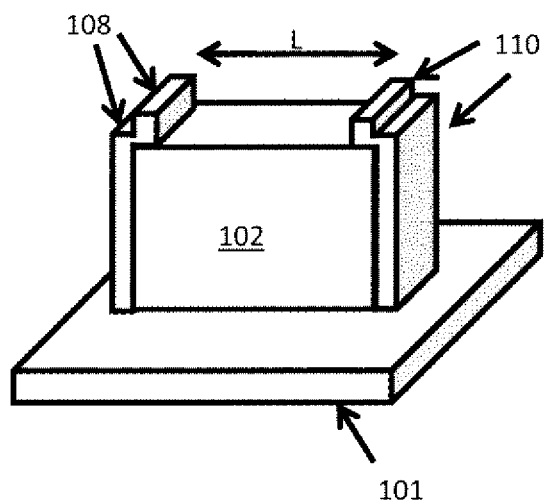
Figure 1C:
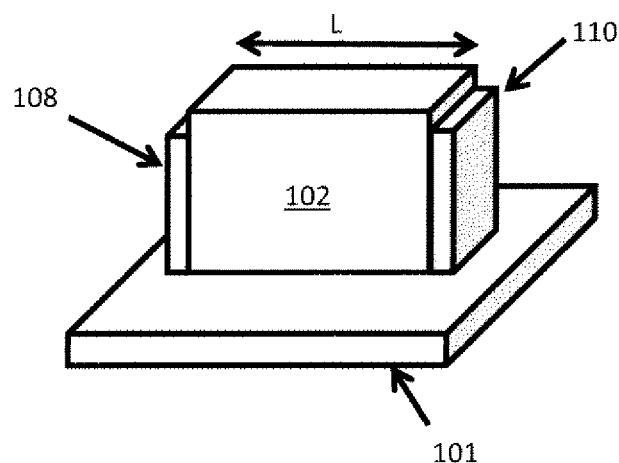
Figure 1D:
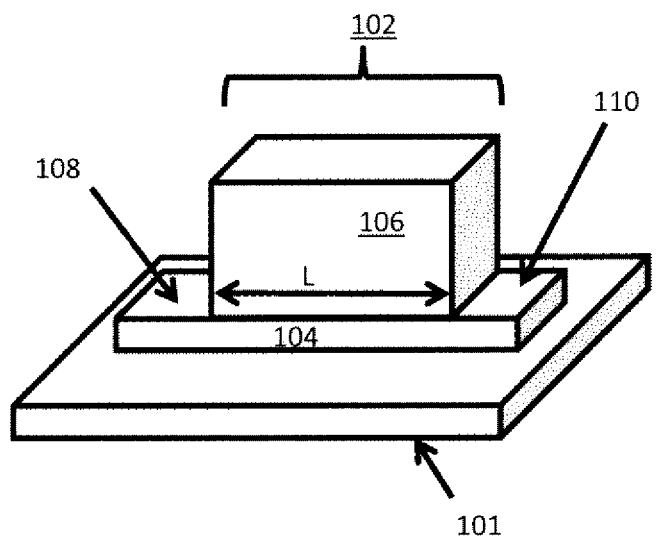

The various exemplary embodiments of the invention are not limited to the structure shown in FIG. 1A. Rather, other structures can be used, as shown in FIGS. 1B-1E. FIGS. 1B-1D perspective views of alternate configurations for a TES device. In a first configuration, as shown in FIG. 1B, a TES device 130 is shown. The configuration of device 130 is generally similar to that shown in FIG. 1A. However, in device 130, the leads are formed by superconducting leads 108 and 110 overlapping body 102. Thus, a portion of leads 108 and 110 contacts the sidewall portions of body 102. However, for purposes of adjusting $T_c$, the spacing of interest is still the same as in FIG. 1A, the spacing between the leads on the top of body 102, as shown in FIG. 1B.

In another configuration, as shown in device 140 in FIG. 1C, the leads are formed on at least a portion of the sidewalls of body 102. In such a configuration, the spacing of interest is then the length of the body 102. In yet another configuration, as shown in device 150 in FIG. 1D, rather than forming leads 108 and 110 separately from superconducting layer 104, they are formed concurrently. In particular, once superconducting layer 104 is formed, normal metal layer 106 is formed over only a portion of superconducting layer 104. As a result, the portions of superconducting layer 104 having no normal metal material disposed thereon form the leads 108 and 110, as shown in FIG. 1D. In such a configuration, the body is defined by the normal metal layer and the directly underlying portion of superconducting layer 104. As a result, similar to device 140 in FIG. 1C, the spacing of interest is the length of the normal metal layer 106.

Figure 1E:
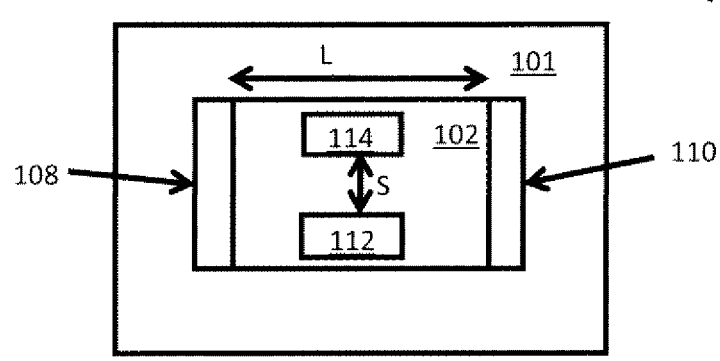
FIG. 1E shows a plan-view of a TES device.

As described above, in additional to providing a spacing for L to adjust $T_c$, $T_c$ can also be adjusted by selection of materials, layer thicknesses, and incorporation of magnetic impurities. However, in some exemplary embodiments of the invention, in addition to adjustment of the lead spacing, normal metal features can be disposed on a S/N bilayer (i.e., superconducting/normal metal/substrate) between the leads. This is shown in FIG. 1E. FIG. 1E is a plan-view schematic of a TES device 150 in accordance with some exemplary embodiments of the invention. As shown in FIG. 1E, between the leads 108 and 110, normal metal features 114 and 116 are formed on the top of body 102. In the various exemplary embodiments of the invention, the shape of such features can vary. Further, any combination of geometric shapes can be used in the various exemplary embodiments of the invention for features 114 and 116.

Typically, such features are provided to reduce excess electrical noise in the devices and give detectors an improved energy resolution. However, the present inventor has found that for at least some types of TES device structures, these additional normal metal features can also be used, in conjunction with the spacing L, provide further adjustment of $T_c$ in areas far from leads 114 and 116. In particular, by changing the separation distance S between features 114 and 116, a lateral inverse proximity effect is induced countering the effect of L. The size of the reduction in $T_c$ is found to scale as $\sim 1/S^2$. Thus, in exemplary embodiments of the invention including such features, adjustment of both L and S can be used to adjust the effective $T_c$ of the TES device.

Figure 2:
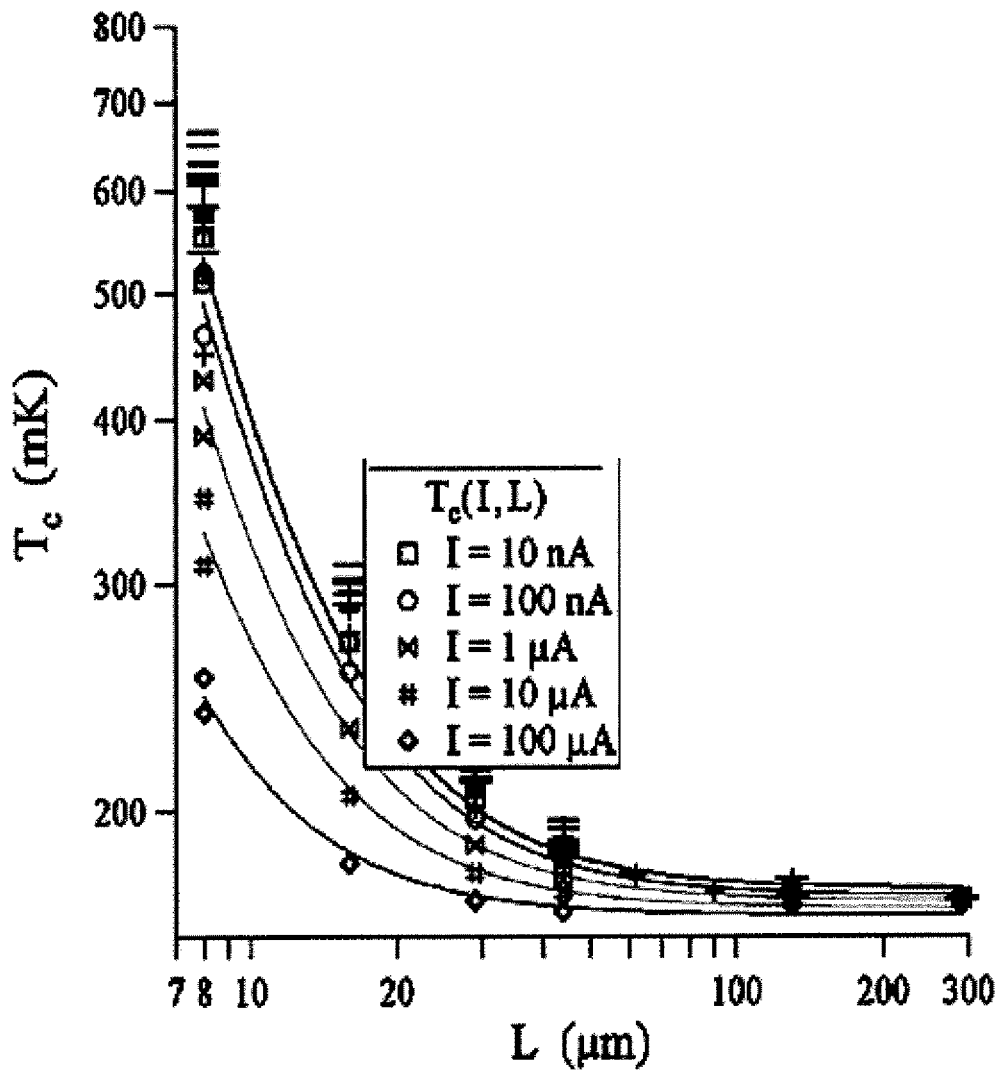
FIG. 2 shows a log-log plot of measurements of effective $T_c$ for different currents as a function of lead spacing (L)

As described above, the relationship between the change in $T_c$ and spacing L is related by $\Delta T_c \sim 1/L^2$. This is shown in FIG. 2. FIG. 2 shows a log-log plot of measurements of effective $T_c$ for different currents as a function of lead spacing (L). The fabricated TES devices were measured using currents of 10 nA, 100 nA, 1 uA, 10 uA, and 100 uA. The data for FIG. 2 was collected by measurements of TES devices having a body including a bilayer of 55 nm molybdenum (Mo) and 210 nm of gold (Au), where $T_c$ for Mo ~0.9K and $T_{ci}$ for the body is ~170.9K. The TES devices further include superconducting leads fabricated from a molybdenum/niobium (Mo/Nb) alloy, having a $T_c$ ranging from 3.5-7.1K, with a lead spacing (L) ranging from 8 to 290 um.

As shown in FIG. 2, the measurements exhibit two characteristics. First, FIG. 2 shows that as electrical current is increased, the overall variation in $T_c$ is reduced. For example, the data points associated with 100 uA current show that $T_c$ goes from about 169.5 mK at a 290 um spacing to 240 mK at a 8 um spacing. In contrast, the measurements associated with 10 nA current show that $T_c$ goes from a little over 171 mK at a 290 um spacing to over 500 mK at a 8 um spacing. Second, FIG. 2 shows that as lead spacing varies, the $T_c$ of the TES device varies approximately as $1/L^2$. Since $T_{ci}$ of the body is relatively weakly current dependent (~171 mK), the observed variation in $T_c$ thus reflects the change induced in the $T_c$ of the TES device provided by the superconductivity induced by the Mo/Nb leads. Thus, by adjusting the lead spacing from 8 um to 290 um, the $T_{ci}$ of the body can be adjusted as much as ~100's of mK and to less than ~1 mK. Although, the lead spacing can be increased beyond 100's of microns, this results in shifts of less than 1 mK.

Accordingly, since the relationship between lead spacing and $T_c$ is predictable and the range of spacing over which the longitudinal proximity effect is operative induces changes in $T_c$ of 100 mK or less, such adjustment of lead spacing can be used during design and fabrication of high-resolution TES devices with target $T_c$'s in the 100's of mK. Such a design methodology is illustrated in FIG. 3.

Figure 3:
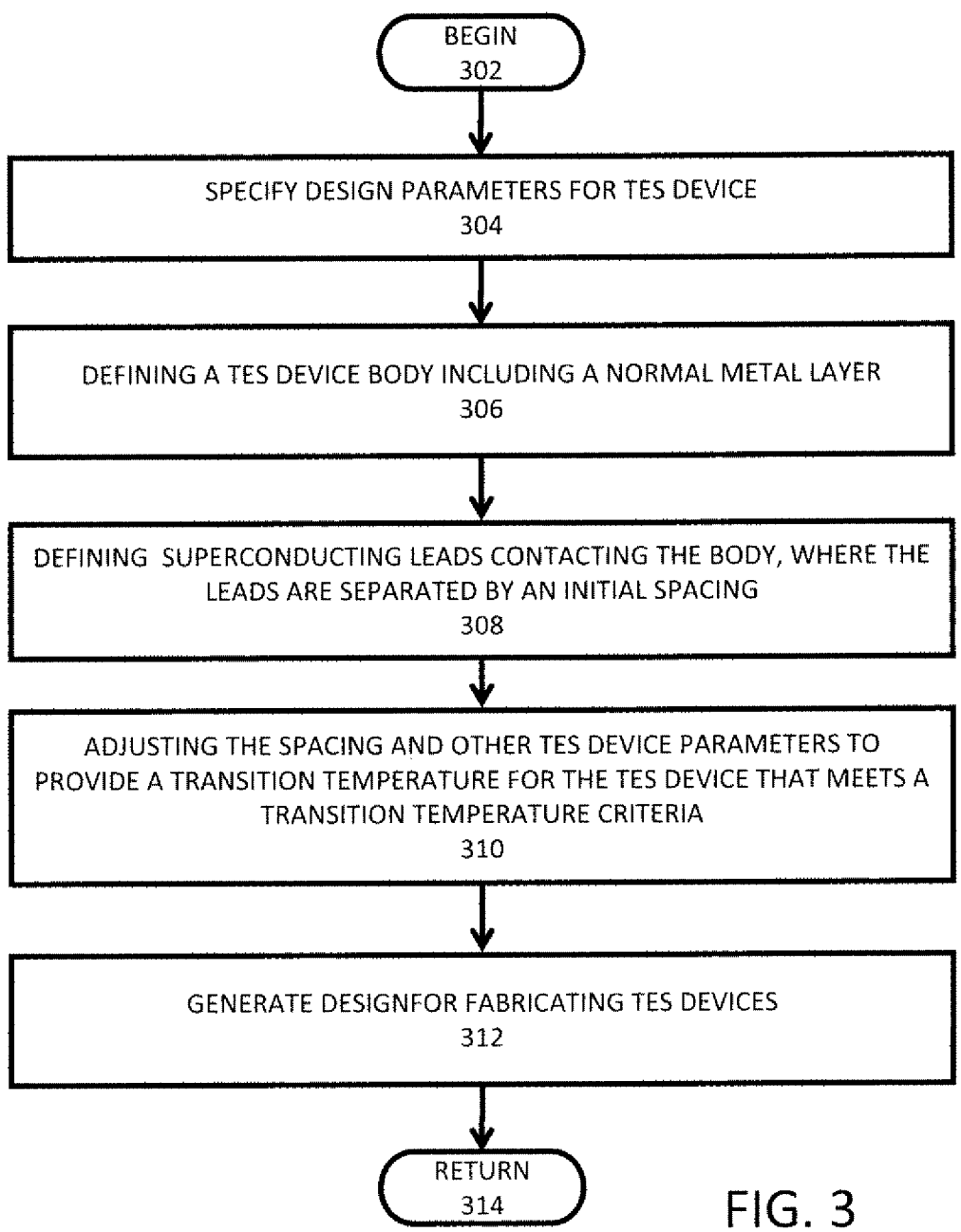
FIG. 3 is a flowchart of steps in an exemplary method for designing a TES device in accordance with an exemplary embodiment of the invention.

FIG. 3 is a flowchart of steps in an exemplary method 300 for designing a TES device in accordance with an exemplary embodiment of the invention. Although only a limited number of steps are illustrated in FIG. 3, a design method in accordance with an exemplary embodiment of the invention can include more or less steps than those shown in FIG. 3. The method 300 can be implemented in a computer system, such as a design or computer-aided-draft (CAD) tool for designing integrated circuits including TES sensors. However, the various exemplary embodiments of the invention are not limited in this regard and method 300 and other related methods can be implemented in a variety of other design systems or platforms.

Method 300 begins at step 302 and continues on to step 304. At step 304, the design parameters for the TES device to be fabricated are specified. For example, transition temperature criteria for the TES device, operating currents to be used, and any other design parameters can be specified for the TES device. Once the design parameters are selected at step 304, the method can continue to step 306. At step 306, the TES device body can be specified. That is, the composition (including any doping) and thickness of layers in the TES device body can be specified. Additionally, the dimensions and position of the body on a supporting substrate can also be specified at step 306. Once the body is defined at step 306, method 300 can proceed to step 308. At step 308, superconducting leads can be specified for the TES device. That is, the composition and thickness of the one or more layers comprising the superconducting leads can be specified. Additionally, the dimensions and position of the leads in the TES device can also be specified at step 308.

As a result of steps 306 and 308, a TES device is defined with leads having some initial spacing. Therefore, the TES device will initially have some initial effective $T_c$, corresponding to the effect of the superconducting layer in the device body and the degree of superconducting order induced by the superconducting leads. However, in many cases, the effective $T_c$ may not meet the criteria specified at step 304. Therefore, at step 310, the spacing between the leads can be adjusted until the effective $T_c$ meets the criteria specified at step 304. This adjustment can be performed in a variety of ways, for example, the adjustment can be done by solving or evaluating a function $T_c(I, L)$ to determine the correct spacing (L) needed for the current (I) to be used in the sensor. Alternatively, the adjustment can be performed using a lookup function and/or interpolation techniques using a table or set of pre-define values for L for various types of TES body structures and currents. In some exemplary embodiments of the invention, an iterative process can be used to fine tune the value for L by adjustment of lead spacing and adjustment of layer thickness for the TES device body.

In some exemplary embodiments of the invention, an additional degree of freedom may be needed for defining the TES device. That is, the control of L may be limited such that the target $T_c$ cannot be achieved solely by modulation of $T_c$. Accordingly, in some exemplary embodiments of the invention, step 310 can also include adjustment of other TES device parameters. For example, Step 310 can include adjustment of layer thickness, composition, dimensions, and doping. Further, step 310 can include adding normal metal features, as described above with respect to FIG. 1E, and adjusting the spacing S together with the spacing L.

Once the value for L (and any other dimensional parameters adjusted, such as S or device dimensions) is selected at step 310, the method can proceed to step 312. At step 312, a final design set is generated for fabricating the TES device. For example, a design or drawing set can be generated. This final design set can then be used to fabricate a lithography mask set and/or a shadow mask set for the TES device and any other devices to be formed on the supporting substrate. However, the various exemplary embodiments of the invention are not limited in this regard. Thereafter, the method 300 proceeds to step 314 to resume previous processing, including repeating method 300.

Although method 300 is suitable for designing TES devices under well controlled processing conditions, in some cases, the amount of variability in layer thickness and/or contamination levels can result in improper $T_c$ values. Accordingly in some exemplary embodiments of the invention, the generation of the design at step 312 can include generating TES devices with various lead spacing amounts. For example, based on the selected spacing at step 310, the TES devices specified in the final design can include TES devices with the selected lead spacing and other TES devices with a lead spacing that is larger and/or smaller than the lead spacing selected at step 310. In such exemplary embodiments, the variation in lead spacing can be predefined. For example, the variation can be selected according to the amount of process variation that is expected. However, the various exemplary embodiments of the invention are not limited in this regard and the variation in lead spacing can be selected according to any other criteria. Thus, if process variations occur, the variation in lead spacing can be used to ensure that at least some of the devices fabricated will be suitable for the intended sensor application. Sufficient variation in lead spacing L by design means for some L in the range of all L's made will compensate for unpredictable fabrication variation in $T_{ci}$ of 102 producing either a single device or an array of devices with an operating $T_c$ in the targeted range. This method of L variations in mask design compensating for undesired fluctuations and variations in $T_{ci}$ of TES body 102 is not limited to S/N bilayer or multilayer TESs. For example it can also be used when 102 is a uniform superconductor, a normal metal, a magnetically doped superconductor, magnetically doped normal metal, semiconductor or semi-metal.

Figure 4:
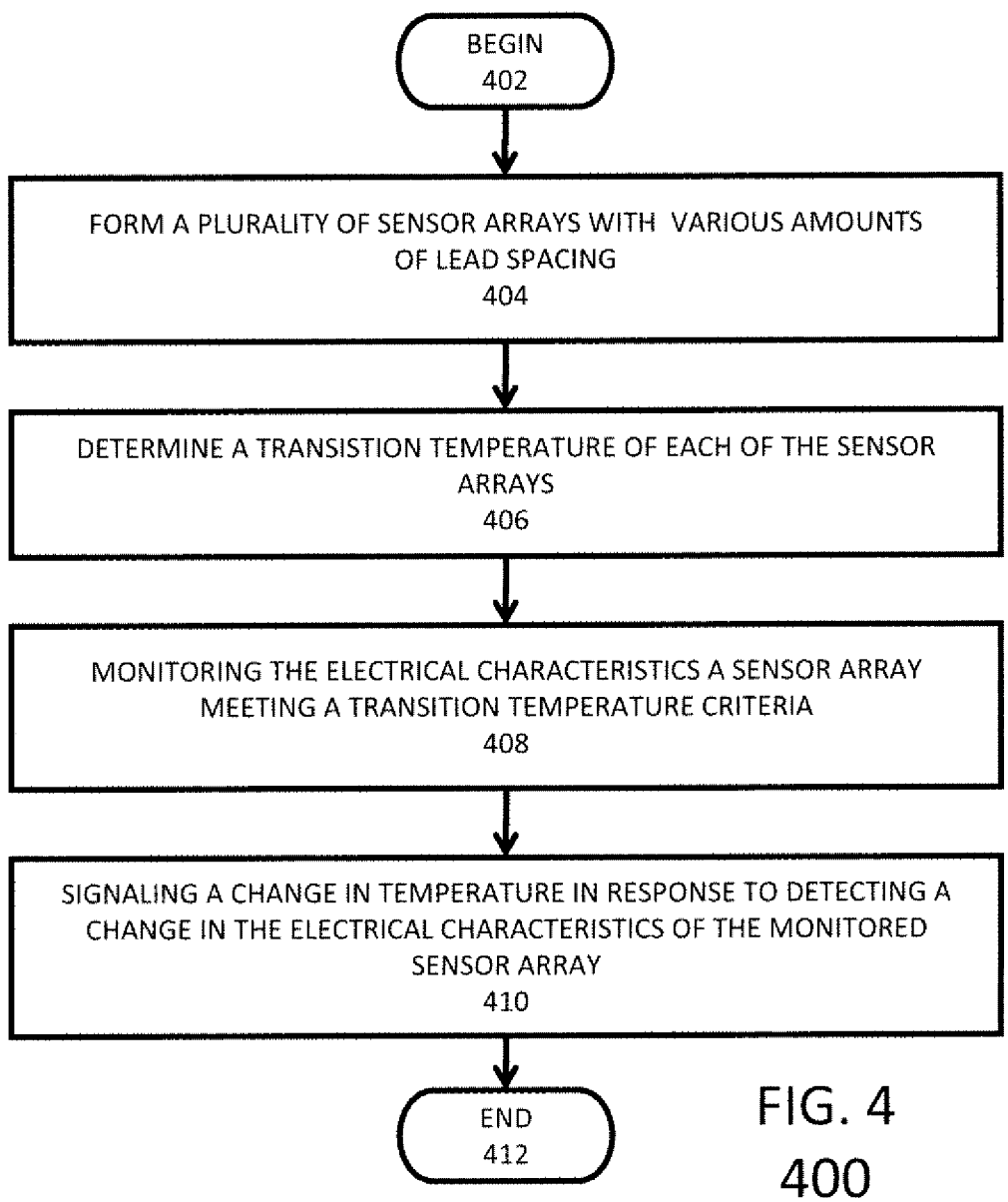
FIG. 4 is a flowchart of steps in an exemplary method for fabricating a sensor using a TES device in accordance with an exemplary embodiment of the invention.

Once the design of the TES devices is obtained, as in FIG. 3 above, the TES devices can be fabricated and thereafter incorporated into a sensor. Such a process is illustrated in FIG. 4. FIG. 4 is a flowchart of steps in an exemplary method 400 for fabricating a sensor using a TES in accordance with an exemplary embodiment of the invention. Method 400 begins at step 402 and continues to step 404. At step 404, a plurality of sensor arrays is formed with various amounts of lead spacing. For example, the design obtained in method 300 above can be used to generate a mask set (lithography and/or shadow) for forming the various sensors arrays. The mask set can then be used to form the various TES devices.

An exemplary fabrication process, based on photolithography, would include first depositing the layers of the TES device body on a supporting substrate with an electrically insulating surface. Such layers can be deposited using physical vapor deposition, chemical vapor deposition, evaporation, sputtering, or any other techniques for depositing normal metals, superconducting metals, or any alloys thereof. Such deposition processes can also include intervening surface preparation processes to reduce the level of contaminants between the layers. Thereafter, a first mask, based on the design generated in method 300, can be used to define the area of each TES device body. For example, an etch mask can be formed using photosensitive layers alone or in combination with one or more hard mask layers. The etch mask can then be used to remove excess material using wet or dry etch processes.

Once the TES device bodies are defined, the layers for forming the superconducting leads can be deposited. Such layers can also be deposited using physical vapor deposition, chemical vapor deposition, evaporation, or any other techniques for depositing superconducting metals or any alloys thereof. Such deposition processes can also include intervening surface preparation processes to reduce contaminants between the layers. Thereafter, a second mask, also based on the design generated in method 300, can be used to define the areas and spacing of the superconducting leads. For example, an etch mask can be formed using photosensitive layers alone or in combination with one or more hard mask layers. The etch mask can then be used to remove excess material using wet or dry etch processes.

Although the process above has been described in terms of utilizing photolithography and etch processes to form the device body and the leads, the various exemplary embodiments of the invention are not limited in this regard. In some exemplary embodiments of the invention, additive processes can also be used. For example, the various layers and features of the TES device can be fabricated by e-beam evaporation and/or sputtering techniques using shadow masks to define the deposition areas. In another example, the TES device body and/or the superconducting leads can be formed using a damascene process or any other additive process suitable for the types of normal metal and superconducting materials being used.

Referring back to FIG. 4, once the sensor arrays are formed at step 404, the method 400 can continue to step 406. At step 406, the transition temperature of each array can be determined. Such methods are well known to those of ordinary skill in the art and will not be described here. Thereafter, at step 408, a sensor can be formed by monitoring the electrical characteristics of the array that meets the transition temperature criteria for the sensor. This can include separating the useful TES devices from a substrate and incorporating the TES devices into a sensor system. Afterwards, at step 410, a signal indicating an incident particle or other event can be generated in response to a change in the electrical characteristics being monitored. This signal can then be used to provide feedback to a user. For example, the signal can to used to generate visual, audio, or electronic indicia of the occurrence of a particle striking the sensor. The method 400 can then end at step 412.

In some exemplary embodiments of the invention, various dimensional parameters can vary to increase the likelihood of obtaining devices meeting the transition temperature criteria. For example, in addition to varying L, the masks used can also vary dimensions of the body and the shape and spacing S of any normal metal features disposed on the body.

The methods 300 and 400 are generally described above with respect to forming TES devices including a TES device body that includes a bilayer structure including a superconducting layer, a normal metal layer disposed on the superconducting layer, and superconducting leads disposed on the normal metal layer. However, the various exemplary embodiments of the invention are not limited in this regard. In some exemplary embodiments of the invention, the TES device body can include solely one or more normal metals layers (i.e., a metal, semimetal, or semiconductor that does not have superconducting properties at the designed operating temperature). In such exemplary embodiments of the invention, the longitudinal proximity effect described above is still operative to induce a superconducting order in the normal metal layer(s). Thus the TES device shown in FIG. 1A can exclude layer 104 or layer 104 can also be a normal metal layer or an electrically insulating layer. In such exemplary embodiments, the lead spacing needed to induce superconductivity is generally smaller than that for bilayer structure.

In such structures, the superconducting order from the superconducting leads 108 and 110 diffuses into the all normal metal body 102 up to some characteristic length. As a result, the superconducting order is strongest at the regions in 102 closest to 108 and 110 and decays inside 102 until the minimum is reached, typically halfway between lead 108 and 110 (assuming leads 108 and 110 are substantially the same). This characteristic length for the penetration of superconducting order can be approximately given by the normal metal coherence length. In general, this length can vary based on the type of material and the temperature. In particular, the normal metal $\xi_N$ coherence length can be given by:

$$\xi_N = \sqrt{\frac{\hbar D}{2\pi k_B T}}, \qquad (1)$$

where $\hbar$ is Planck's constant over $2\pi$, $k_B$ is Boltzmann's constant, T is the operating temperature, and D is the electronic diffusivity of the body. The electron diffusivity D is given by:

$$D = \frac{v_F l}{3}, . \qquad (2)$$

Where $v_F$ is the Fermi velocity and l is the mean free path for elections in the body. For a sufficiently thin body, the mean free path is given by the film thickness (thickness limited mean free path). For thicker films the mean free path is given by the bulk mean free path of body 102.

In the bilayer structure described above, the lead spacing was shown in FIG. 2 to vary from 8 um to ~300 um. However, because of the more limited superconducting order induced by the leads in the case of a body lacking a superconducting layer, the range of spacing over which such a configuration can be used to provide a TES device is substantially smaller, generally on the order of 50 um or less (i.e., ~<20× the normal coherence length or less), depending on operating conditions and the configuration of the TES device. However, as the spacing is further decreased, (i.e., ~<10× the normal coherence length or less), the likelihood of an operable TES is substantially increased. For example, the present inventor has found that such TES devices with a spacing of 10 um or less can be reliably fabricated.

Figure 5:
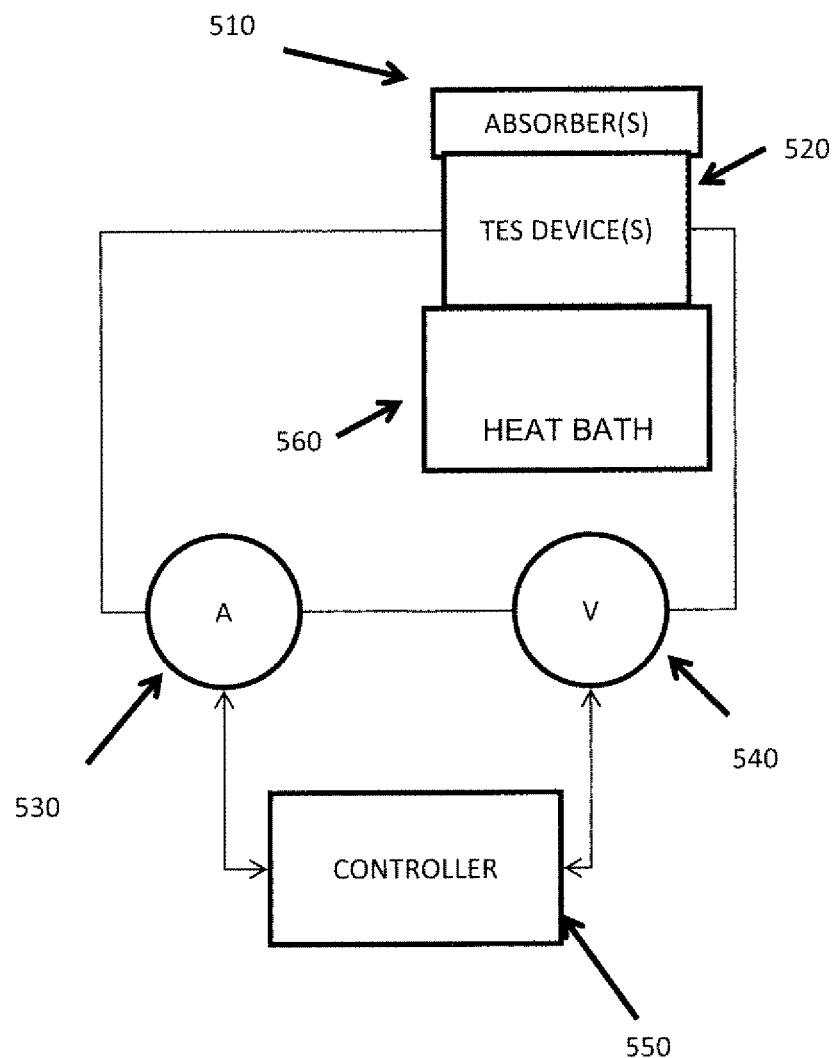
FIG. 5 is an exemplary configuration of a sensor, including a TES device designed in accordance with the various exemplary embodiments of the invention.

As described above, superconducting TES devices are typically used to form particle detectors. An exemplary configuration of a detector 500, including a superconducting TES device, designed in accordance with the various exemplary embodiments of the invention is shown in FIG. 5. Although FIG. 5 shows a specific architecture for detector 500, the various exemplary embodiments of the invention are not limited in this regard. Rather in the various exemplary embodiments of the invention, a detector can include more or less components than shown in FIG. 5 and can have a different arrangement of components than that shown in FIG. 5.

As shown in FIG. 5, particle detector 500 includes particle absorber(s) 510, TES device(s) 520, and a means for measuring superconducting transitions. In the illustrated exemplary embodiment the measuring means is bias voltage source 540 and current measuring device 530 coupled to a controller 550. The absorber 510 can be any type of high thermal conductivity material in contact with the TES device(s) 520 to enhance detection of incident particles and/or changes in temperature. Additionally, the absorber(s) 510 and TES device(s) are configured in such a way that the absorber doesn't disturb the electrical readout TES circuit (e.g. does not short the bias current from the TES) and also the absorber must have strong thermal coupling to the TES and either decoupled or very weakly thermally coupled to the heat bath such that the energy deposited in the absorber flows into the TES.

As described above, the TES device(s) 520 has a superconducting state, a normal conducting state and a transition region between. The conductivity state of the TES device(s) 520 depends on the temperature of the TES device 520, which intern depends upon the bias power (i.e., the operating current) for the TES device 520 and the thermal conductance to the heat bath 560. As described above, the transition region is characterized by a transition temperature, $T_c$, and by a transition width. The resistive transition width, that is generally a width in temperature and current, is used in lieu of transition edge to emphasize the fact that the transition is not instantaneous but rather requires a finite temperature range. In operation, the TES device(s) 520 is cooled to a temperature below the transition temperature. A TES DC bias (i.e., the operating current) is then increased to bias the TES device 520 inside the sharp temperature-dependent resistive transition. However, since the TES device 520 will dissipate power the TES device 520 reaches a balance between the heat flowing from the TES device 520 to the heat bath 560. However, any disturbing of this balance, due to, for example, a flux of particles, can still be detected. For example, a flux of detected particles will cause a change in steady state TES temperature when operating as a bolometer, sensed by measuring a change in resistance in the TES. When operating as a calorimeter the absorbed energy raises the TES temperature, sensed by measuring a resistance pulse corresponding to the energy of the absorbed particle. Further, when a particle strikes the absorber(s) 510 and/or the TES device(s) 520, the strike also causes at least some finite amount of heating in the absorber 510 or the TES device(s) 520. The heating can result in changes in temperature of the TES devices(s) 520. As a result, the change in temperature produces large changes in the conducting properties of the TES device(s) 520, which can be monitored by controller 550 to detect a strike.

Figure 6:
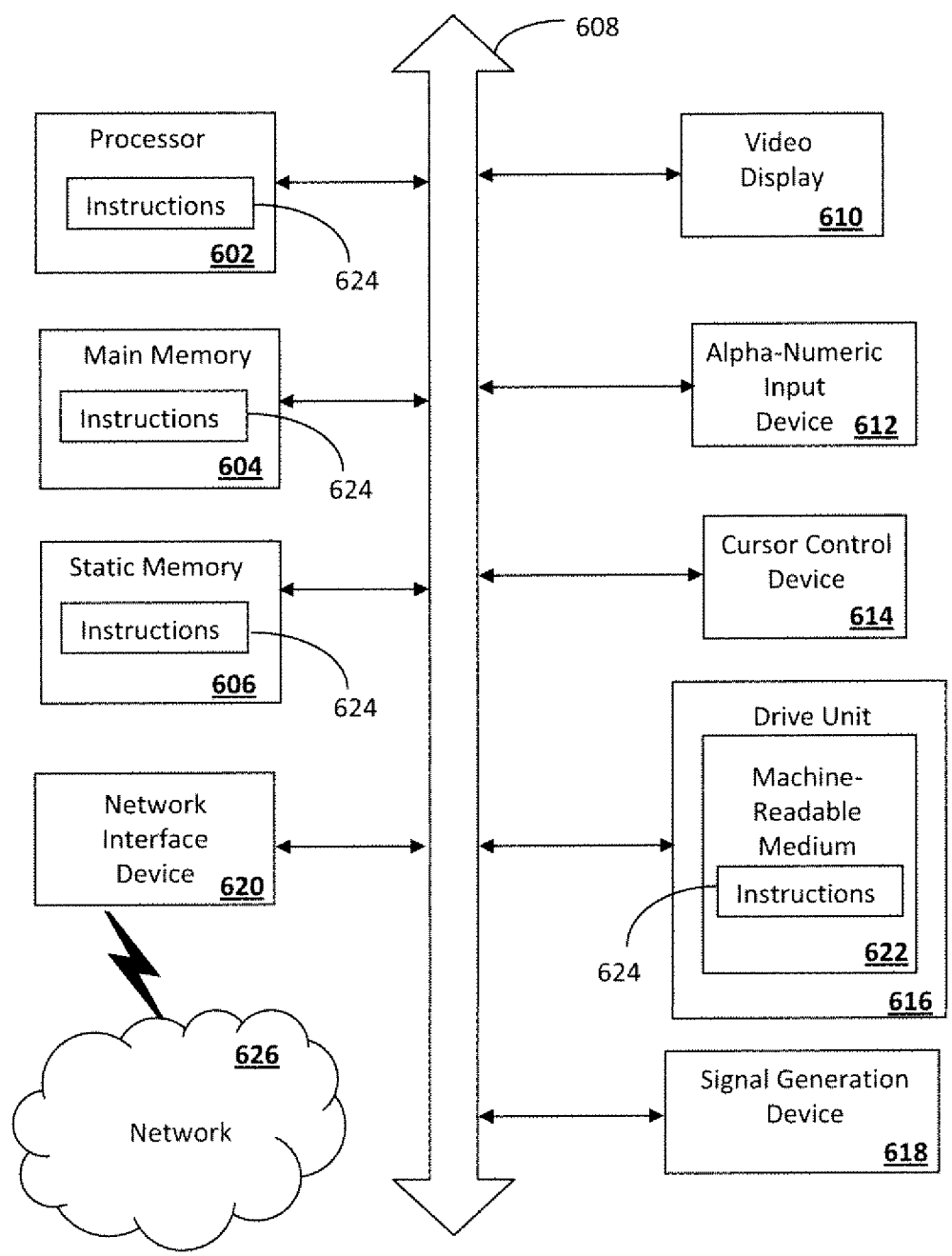
FIG. 6 is a schematic diagram of a computer system for executing a set of instructions that, when executed, can cause the computer system to perform one or more of the methodologies and procedures described herein.

FIG. 6 is a schematic diagram of a computer system 600 for executing a set of instructions that, when executed, can cause the computer system to perform one or more of the methodologies and procedures described above. In some exemplary embodiments, the computer system 600 operates as a standalone device. In other exemplary embodiments, the computer system 600 can be connected (e.g., using a network) to other computing devices. In a networked deployment, the computer system 600 can operate in the capacity of a server or a client developer machine in server-client developer network environment, or as a peer machine in a peer-to-peer (or distributed) network environment.

The machine can comprise various types of computing systems and devices, including a server computer, a client user computer, a personal computer (PC), a tablet PC, a laptop computer, a desktop computer, a control system, a network router, switch or bridge, or any other device capable of executing a set of instructions (sequential or otherwise) that specifies actions to be taken by that device. It is to be understood that a device of the present disclosure also includes any electronic device that provides voice, video or data communication. Further, while a single computer is illustrated, the phrase "computer system" shall be understood to include any collection of computing devices that individually or jointly execute a set (or multiple sets) of instructions to perform any one or more of the methodologies discussed herein.

The computer system 600 can include a processor 602 (such as a central processing unit (CPU), a graphics processing unit (GPU), or both), a main memory 604 and a static memory 606, which communicate with each other via a bus 608. The computer system 600 can further include a display unit 610, such as a video display (e.g., a liquid crystal display or LCD), a flat panel, a solid state display, or a cathode ray tube (CRT)). The computer system 600 can include an input device 612 (e.g., a keyboard), a cursor control device 614 (e.g., a mouse), a disk drive unit 616, a signal generation device 618 (e.g., a speaker or remote control), and a network interface device 620.

The disk drive unit 616 can include a computer-readable storage medium 622 on which is stored one or more sets of instructions 624 (e.g., software code) configured to implement one or more of the methodologies, procedures, or functions described herein. The instructions 624 can also reside, completely or at least partially, within the main memory 604, the static memory 606, and/or within the processor 602 during execution thereof by the computer system 600. The main memory 604 and the processor 602 also can be machine-readable media.

Dedicated hardware implementations including, but not limited to, application-specific integrated circuits, programmable logic arrays, and other hardware devices can likewise be constructed to implement the methods described herein. Applications that can include the apparatus and systems of various exemplary embodiments broadly include a variety of electronic and computer systems. Some exemplary embodiments implement functions in two or more specific interconnected hardware modules or devices with related control and data signals communicated between and through the modules, or as portions of an application-specific integrated circuit. Thus, the exemplary system is applicable to software, firmware, and hardware implementations.

In accordance with various exemplary embodiments of the present disclosure, the methods described herein can be stored as software programs in a computer-readable storage medium and can be configured for running on a computer processor. Furthermore, software implementations can include, but are not limited to, distributed processing, component/object distributed processing, parallel processing, virtual machine processing, which can also be constructed to implement the methods described herein.

The present disclosure contemplates a computer-readable storage medium containing instructions 624 or that receives and executes instructions 624 from a propagated signal so that a device connected to a network environment 626 can send or receive voice and/or video data, and that can communicate over the network 626 using the instructions 624. The instructions 624 can further be transmitted or received over a network 626 via the network interface device 620.

While the computer-readable storage medium 622 is shown in an exemplary embodiment to be a single storage medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any tangible medium that is capable of storing, encoding or carrying a set of instructions for execution by the machine and that cause the machine to perform any one or more of the methodologies of the present disclosure.

The term "computer-readable medium" shall accordingly be taken to include, but not be limited to, solid-state memories such as a memory card or other package that houses one or more read-only (non-volatile) memories, random access memories, or other re-writable (volatile) memories; magneto-optical or optical medium such as a disk or tape; as well as a device, apparatus, or portion thereof carrying carrier wave signals such as a signal embodying computer instructions in a transmission medium; and/or a digital file attachment to e-mail or other self-contained information archive or set of archives considered to be a distribution medium equivalent to a tangible storage medium. Accordingly, the disclosure is considered to include any one or more of a computer-readable medium or a distribution medium, as listed herein and to include recognized equivalents and successor media, in which the software implementations herein are stored.

Although the present specification describes components and functions implemented in the exemplary embodiments with reference to particular standards and protocols, the disclosure is not limited to such standards and protocols. Each of the standards for Internet and other packet switched network transmission (e.g., TCP/IP, UDP/IP, HTML, and HTTP) represent examples of the state of the art. Such standards are periodically superseded by faster or more efficient equivalents having essentially the same functions. Accordingly, replacement standards and protocols having the same functions are considered equivalents. The various exemplary embodiments described above are provided by way of illustration only and should not be construed to limit the scope of the disclosure. Those skilled in the art will readily recognize various modifications and changes that may be made to the principles described herein without following the exemplary embodiments and applications illustrated and described herein, and without departing from the spirit and scope of the disclosure.

I claim:

1. A transition edge sensor (TES), the TES comprising:
a substrate having an electrically insulating surface;
a normal metal layer disposed on said electrically insulating surface;
a first superconducting lead disposed on a first portion of said normal metal layer; and
a second superconducting lead disposed on a second portion of said normal metal layer and separated from said first superconducting lead by a lead spacing, said lead spacing less than 20 times a normal coherence length for said normal metal layer for a target transition temperature, wherein the proximity effect of the first and second superconducting leads induces superconducting order into said normal metal layer and wherein the TES operates at a temperature $T<77K$.

2. The TES of claim 1, wherein said lead spacing is less than less than 10 times said normal coherence length for the normal metal layer for the target transition temperature.

3. The TES of claim 1, wherein said lead spacing is less than 10 um.

4. The TES of claim 1, wherein said normal metal layer comprises at least one of a metal, a semimetal, and a semiconductor.

5. The TES of claim 1, wherein said first and said second superconducting leads comprise a superconducting material having a transition temperature higher than the operating temperature and having a transition temperature greater than the transition temperature of the normal metal layer.

* * * * *